United States Patent [19]
Finch et al.

[11] Patent Number: 5,524,208
[45] Date of Patent: Jun. 4, 1996

[54] METHOD AND APPARATUS FOR PERFORMING CACHE SNOOP TESTING USING DMA CYCLES IN A COMPUTER SYSTEM

[75] Inventors: Rick Finch; Jeff Savage, both of Austin, Tex.

[73] Assignee: Dell USA, L.P., Austin, Tex.

[21] Appl. No.: 257,404

[22] Filed: Jun. 9, 1994

[51] Int. Cl.$^6$ ............................. G06F 11/00; G06F 11/30
[52] U.S. Cl. ..................................................... 395/183.01
[58] Field of Search ........................ 395/183.01, 183.18, 395/183.19, 183.20, 184.01, 425

[56] References Cited

U.S. PATENT DOCUMENTS

| | | | |
|---|---|---|---|
| 4,912,632 | 3/1990 | Gach et al. | 364/200 |
| 5,155,845 | 10/1992 | Beal et al. | 395/575 |
| 5,159,671 | 10/1992 | Iwami | 371/10.1 |
| 5,182,752 | 1/1993 | DeRoo et al. | 371/40.1 |
| 5,185,879 | 2/1993 | Yamada et al. | 395/425 |
| 5,228,134 | 7/1993 | MacWilliams et al. | 395/425 |

*Primary Examiner*—Hoa T. Nguyen
*Attorney, Agent, or Firm*—Henry N. Garrana; Mark P. Kahler; Michelle M. Turner

[57] ABSTRACT

A method and apparatus for performing cache snoop testing on personal computers using software to initiate DMA cycles. The computer system includes an extended capabilities parallel port (ECP), which includes a 16 bit first-in first-out buffer (FIFO) that can be accessed in a test mode where software can manually write and read the FIFO. This FIFO in the ECP parallel port is used according to the present invention to implement cache snoop testing diagnostics on personal computers. In the preferred embodiment, various hardware subsystems such as system memory, the ECP port, and the DMA controller are tested first to ensure that, if a failure occurs during cache testing, the system can differentiate between cache snoop failures and other subsystem failures. Cache snoop testing according to the present invention uses the capability provided by the ECP parallel port to generate DMA cycles which transfer data from the ECP FIFO buffer into the system memory via software. Various algorithms can be used to perform cache snoop testing depending upon the cache architecture, i.e., write-through versus write-back and whether the cache system includes only first or both first and second level cache systems. Therefore, cache snoop testing can be performed reliably in software without the need for expensive custom test hardware.

18 Claims, 5 Drawing Sheets

METHOD AND APPARATUS FOR PERFORMING CACHE SNOOP TESTING USING DMA CYCLES IN A COMPUTER SYSTEM

FIELD OF THE INVENTION

The present invention relates to the testing of cache memory systems in computer systems, and more particularly to a method and apparatus for performing cache snoop testing by initiating DMA cycles through the parallel port of the computer system.

DESCRIPTION OF THE RELATED ART

Modern computer systems are required to manipulate and store increasingly larger amounts of code and data. One method that is commonly used to speed up memory/accesses in computer systems is to utilize what is relented to as cache memory. A cache memory is a small amount of very fast, and expensive, zero wait state memory that is interposed between a device which regularly requests data and a storage device. For example, the most common type of cache memory is referred to as a microprocessor cache memory. The microprocessor cache memory is interposed between the microprocessor and main memory and stores frequently used code and data. When a microprocessor requests data and the data resides in the cache, then a cache hit occurs and the data is provided back to the microprocessor without requiring a main memory access. If the requested data does not reside in the cache, then a cache miss occurs, and the microprocessor must retrieve the requested data from main memory.

Cache management is usually performed by a device referred to as a cache controller. The cache controller determines the organization of the cache memory as well as the write policy that is enforced. For example, a cache memory may be organized as either a direct mapped cache or a set associative cache. In order to more fully understand cache organization, it is helpful to conceptualize main memory as comprising a plurality of pages of memory of a certain size. A number of the upper address bits comprising a memory address can individually access each of these conceptual pages, while the remaining or lower address bits comprise an offset within a respective page.

In a direct mapped cache, the cache memory is organized as a single conceptual page of memory, and there is a single unique location in the cache memory where a piece of data may reside. This unique location is determined by the offset or lower address bits of the address of the respective data. The upper address bits, referred to as the tag, are stored in a separate block of memory referred to as the tag memory. Each location in the cache memory includes a corresponding tag location which stores the upper address bits of the address corresponding to the data stored in the respective cache memory location.

In a set associative cache design, the cache memory is organized into multiple banks or ways of cache memory where each bank of memory corresponds to a conceptual page in main memory. Thus, in a four-way set associative cache, data having a given address can be stored in either of four places in the cache memory. As with a direct mapped cache, where the data is stored in a respective bank of memory depends on the offset or lower address bits of the address corresponding to the data, and the upper address bits or tag are stored in a corresponding tag location.

In both a direct-mapped and a set associative cache, when a memory access occurs the cache controller performs a tag compare cycle to compare the tag location corresponding to the respective offset where the data might be stored with the upper address bits of the requested address. If the contents of the tag location equal the upper address bits of the memory access, then a cache hit occurs, and the data is provided from the cache directly to the CPU. If a cache miss occurs, the requested data is retrieved from the main memory.

The write policies enforced by a cache controller are generally referred to as either write-through or write-back. In a write-through cache, when a write hit occurs the data is updated in both the cache memory and in main memory simultaneously. In a write-back cache, the data is immediately updated in the cache, but is written back to main memory only when the need arises, such as when another device requests this data from main memory.

A microprocessor architecture may comprise only one cache system or may comprise multiple levels of cache systems. For example, many cache architectures include a first level on-chip cache, referred to as an L1 cache, and a second level external cache, referred to as an L2 cache. Other cache architectures include only an L1 cache or only an L2 cache. In a computer system that includes both an L1 and an L2 cache, a data request is forwarded first to the L1 cache system. If the requested data resides in the L1 cache, the L1 cache provides the requested data to the CPU. If the requested data does not reside in the L1 cache, the request is forwarded to the L2 cache. If the requested data resides in the L2 cache, the L2 cache provides the requested data to the CPU, and the data is also typically stored in the L1 cache. If the requested data does not reside in the L2 cache, the request is forwarded to main memory.

A cache system is generally required to monitor (or snoop) the computer system bus on which it is located to determine if another bus master is accessing main memory. This is necessary to prevent inconsistencies from occurring between the data stored in main memory and the data stored in the cache memory. The operation of a cache system in monitoring main memory requests by other bus masters is referred to as bus watching or snooping.

In a write-through cache design, the cache system is required to snoop the bus to ensure that a bus master does not modify data in the main memory that is also stored in the cache memory. Examples of bus masters which can access main memory independently of the CPU include other processors, a DMA (direct memory access) controller, or expansion cards situated on the expansion bus with bus mastering capability. If a bus master were to update data in the main memory, and a copy of this data also resided in the cache memory, then the cache memory would contain invalid or stale data. Therefore, a write-through cache snoops writes by other bus masters and detects whether a bus controller updates data in main memory that is also stored in the cache memory. If so, the cache memory either updates the respective line in the cache memory where this copy of data is located, or more typically, the cache memory invalidates the respective line where this data is stored.

In a write-back cache design, the cache memory often contains updated or new data that has not yet been updated in the main memory. In other words, a write-back cache memory often includes updated data in a respective location, and the corresponding location in main memory contains invalid or stale data. Therefore, when other bus masters access the main memory, a write-back cache is required to monitor or snoop all bus master accesses, i.e., all bus master write and read cycles to and from the main memory. A write-back cache is required to snoop bus master read cycles to ensure that the bus master is not requesting stale data from the main memory. If a bus master does request stale data from the main memory, the cache memory typically halts the main memory access and writes the updated data back to the main memory before allowing the bus master cycle to proceed. Alternatively, the write-back cache simply interrupts the bus master read cycle and provides the updated copy directly to the requesting bus master, and the requested data is received by the bus master as if the data had come from main memory. A write-back cache is also required to snoop bus master write cycles to determine if a bus master is updating data in main memory that also resides in the cache memory. If this occurs the cache typically either invalidates the respective lines in the cache where this data resides, or latches the data on the bus from the bus master during the write cycle to update the cache's copy of the data. Thus, to summarize, when another bus master accesses the main memory, a write-back cache associated with the main CPU monitors or snoops the memory read and write cycles to ensure that the write-back cache does not have an updated copy of the data requested from the main memory location.

Therefore, when a bus master generates write cycles to main memory, the cache controller of either a write-through or write-back cache performs snoop cycles, i.e., the cache controller latches the address on the bus and performs a tag compare cycle to determine if the memory location being accessed also resides in the cache. If a snoop hit occurs, i.e., if the memory location being accessed is also cached in the cache memory, then the cache generally invalidates the respective line in the cache memory, or in some cases updates the respective line, depending on the design of the cache system.

As with main memory, the cache memory must generally be tested during power-up of the computer system to ensure that the memory is operating properly. As part of the cache memory testing, it is also desirable to perform cache snoop testing on the cache to ensure that the cache system performs snooping operations properly. As mentioned above, a cache system only snoops bus cycles when another bus master generates main memory accesses. This other bus master could be another microprocessor in a multiprocessor computer system, an intelligent bus master situated on the expansion bus such as an EISA bus master, or the DMA controller initiating DMA cycles to the main memory. However, most computer systems today do not include multiple processors or intelligent bus masters situated on the expansion bus. Further, even if a second processor or intelligent bus master is available, it is oftentimes difficult to have the second processor or bus master initiate main memory cycles during the POST (power on self test) routine in order to perform cache snoop testing. Therefore, the principal method for performing cache snoop testing has been to initiate DMA cycles during the POST routine. However, the ability to perform cache snoop testing on personal computers has been limited by the inability of software to initiate DMA cycles. One method that has been used to initiate DMA cycles is to use custom test hardware. For background on how custom test hardware has been used to perform cache snoop testing, please see U.S. patent application Ser. No. 08/087,583 titled "A Cache Testability Circuit for Embedded Diagnostics" by Eric William Schieve et al, and filed Jul. 6, 1993.

The only method currently available for software to initiate DMA cycles during the POST procedure has been to use the disk drive subsystem to generate the DMA cycles. In other words, a diskette is inserted into the disk drive to transfer data to main memory using DMA cycles. However, one limitation of this method is that at least one disk drive with the corresponding media, i.e., a floppy disk, must be present in order to generate the DMA cycles. Further, it is not possible to differentiate between failures associated with the disk drive subsystem, such as media failures, drive failures, cable failures, interface failures, etc., and a true cache snoop failure. Since failures associated with the disk drive subsystem are much more likely to occur than failures associated with the cache snoop operation, this method of testing is generally not realistic and does not provide sufficient information. Therefore, realistic cache snoop testing has not been possible on personal computer systems without custom test hardware.

A method and apparatus is greatly desired which allows reliable cache snoop testing in software without the need for expensive, custom test hardware.

SUMMARY OF THE INVENTION

The present invention comprises an improved method and apparatus for performing cache snoop testing in personal computers using software initiated DMA cycles. The present invention provides much more reliable testing results than was available in the prior art yet does not require expensive custom test hardware to perform this testing. In the preferred embodiment, the computer system includes an extended capabilities parallel port (ECP), which is a parallel port developed according to a standard jointly developed by Microsoft and Hewlett Packard. The ECP port standard includes a 16 bit first-in first-out buffer (FIFO) that can be accessed in a test mode where software can manually write and read the FIFO. This FIFO in the ECP parallel port is used according to the present invention to implement cache snoop testing diagnostics on personal computers.

In the preferred embodiment, the system or main memory is first tested in order to ensure that if a subsequent failure occurs during cache testing, the system can differentiate between a memory failure and a cache snoop failure. The ECP hardware is then tested to ensure that the ECP registers in the FIFO are read/writable. The system then tests the DMA channel by configuring the DMA controller for an I/O to memory transfer, zeroing the destination system memory, and then manually loading the FIFO with data patterns and enabling a DMA transtar via the ECP port. This causes the ECP parallel port to initiate DMA cycles to empty the FIFO buffer into system memory. The system memory is then read to ensure that the data patterns originally written to the FIFO buffer in the ECP were properly transferred to the system memory by the DMA controller. Once the ECP parallel port, the DMA controller and the system memory have been tested and are known to be functioning correctly, cache snoop testing begins.

Cache snoop testing uses the capability provided by the ECP parallel port to generate DMA cycles which transfer data from the ECP FIFO buffer into the main memory via software. In one method according to the present invention, cache snoop testing is performed in a computer system that includes a CPU, system memory, a DMA controller and an ECP parallel port buffer. In the preferred method, the CPU writes a data pattern to the buffer, directs the DMA controller to transfer the data pattern from the buffer to a range in the system memory, and then reads the data in the system memory range to determine if the cache snoop cycles occurred properly. It is noted that various algorithms can be used to perform cache snoop testing depending upon the cache architecture, i.e., write-through versus write-back, and whether the cache system includes only first or both first and second level cache systems. In the preferred embodiment, the cache snoop testing is used to ensure that write cycles to main memory generated by another bus master are properly snooped. The cache snoop testing also ensures that, if a snoop hit occurs, the corresponding location in the cache memory is invalidated to prevent the cache memory from storing stale data.

One algorithm that can be used to perform cache snoop testing for either a write-through or write-back cache according to the present invention is as follows. First, the method fills a range of system memory with zero values and then enables the cache system. The method then loads the cache tags by directing the CPU to read the system memory range previously written to. The DMA controller is then configured with the system memory range as a destination, the ECP FIFO buffer is loaded with a pattern and a DMA transfer is initiated via the ECP parallel port. If the cache snooping function is operating properly, the cache memory will snoop the memory cycles during the DMA transfer and will invalidate cache lines within its cache memory due to the fact that updated data is being written to the corresponding locations in the main memory. The method then directs the main CPU to read the system memory range to ensure that the cache lines in this range were invalidated by snoop cycles. If the cache lines were not invalidated by snoop cycles, then the CPU's attempt to read the system memory will result in the data being read from the cache, not from the system memory, and thus the patterns written to system memory by the DMA cycles will not be seen by the processor. Thus, the processor will be able to detect if the snoop invalidations properly occurred.

For a write-back cache system, a more involved method is preferably used to test the snooping function as well as the flushing and disabling functions of the cache system. The method first directs the CPU to fill a range of system memory with zeros. The CPU then enables the cache and loads the cache tags by reading the system memory range previously written to. The method then directs the CPU to fill the cache memory by writing a pattern to the range corresponding to the system memory range previously written to. Thus, the cache memory will comprise updated data, and the corresponding locations in system memory will contain stale or invalid data. The method then configures the DMA controller with the system memory range as a destination, loads the ECP FIFO buffer with a pattern different from the pattern written to the cache memory, and initiates a DMA transfer via the ECP parallel port. If the cache snooping function is operating properly, the cache will snoop these DMA transfer cycles and invalidate the corresponding locations in the cache memory due to the newer updated data being written to system memory. After the DMA transfer has completed, the main CPU flushes and disables the cache, causing any modified lines to be written to system memory. The CPU then reads the system memory range to ensure that the cache lines for the respective range were invalidated by snoop cycles during the DMA transfer. If these respective lines were not invalidated by snoop cycles, modified lines from the cache will have been written to system RAM when the cache was flushed, overwriting the patterns written to system memory by the DMA cycles. However, if the snooping operation functioned properly, the cache memory lines within the cache will have been invalidated by the snoop cycles and thus the flush operation would not have overwritten the patterns written to system memory by the DMA cycles. Other cache snoop testing algorithms for write-through and write-back caches may be used, as desired.

Therefore, the present invention allows cache snoop testing to be performed reliably in software without the need for expensive custom test hardware. Cache snoop testing can be performed on both write-back and write-through caches and on cache architectures that include an L1 cache, an L2 cache or both an L1 and L2 cache.

BRIEF DESCRIPTION OF THE DRAWINGS

A better understanding of the present invention can be obtained when the following detailed description of the preferred embodiment is considered in conjunction with the following drawings, in which.

DETAILED DESCRIPTION OF THE PREFERRED EMBODIMENT

Figure 1:
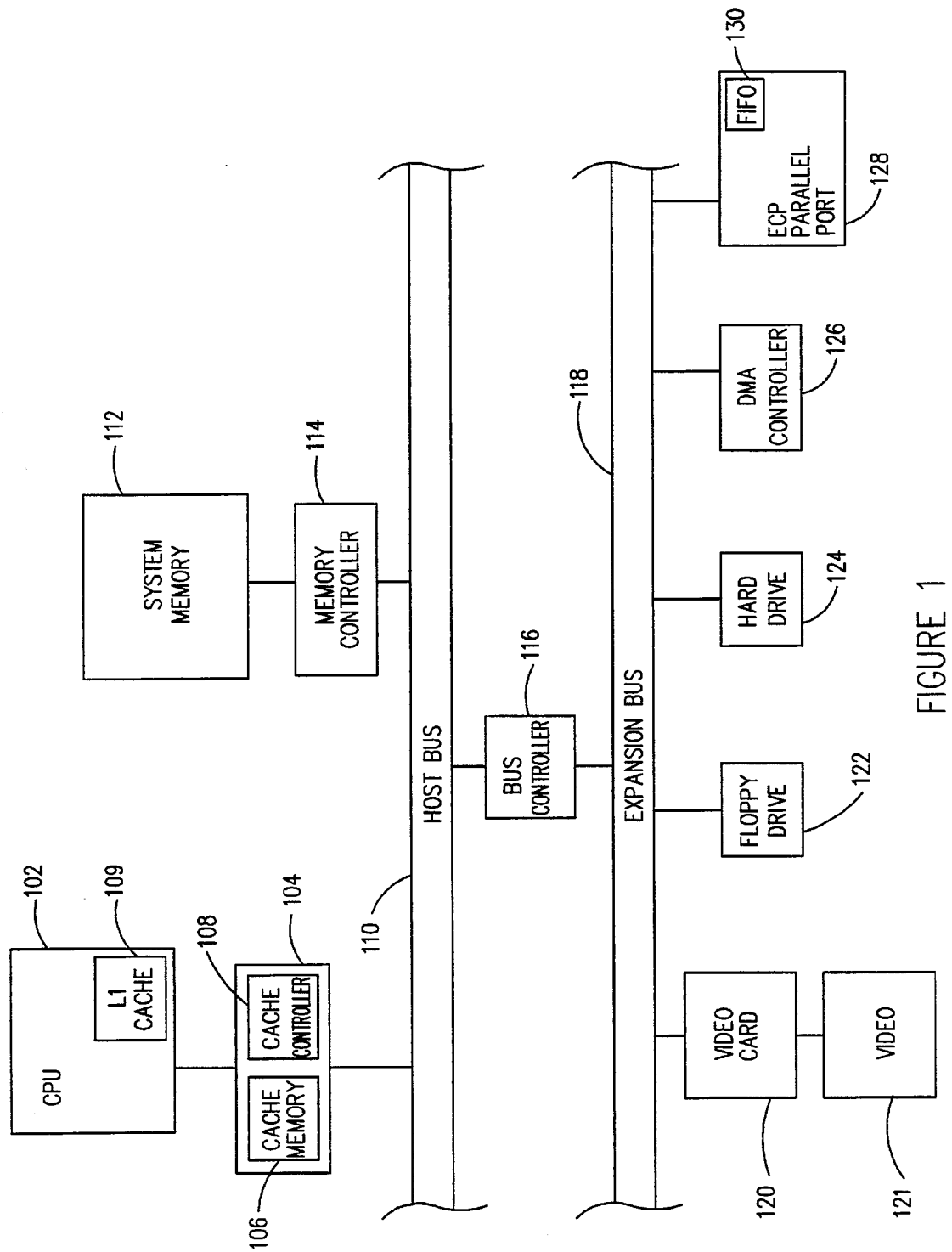
FIG. 1 is a block diagram of a computer system which performs cache snoop testing according to the present invention.

Referring now to FIG. 1, a block diagram illustrating a computer system which performs cache testing according to the present invention is shown. The elements of a computer system not necessary to understand the operation of the present invention have been omitted for simplicity. The computer system includes a central processing unit or CPU 102 which is coupled to a memory or host bus 110. In the preferred embodiment the CPU 102 is an Intel Pentium microprocessor, although it is noted that other processors may be used. The computer system may include a first level or L1 cache system 109. The computer system may also include a second level cache subsystem 104 coupled between the CPU 102 and host bus 110. The second level cache subsystem 104 comprises cache memory 106 and a cache controller 108. The host bus 110 includes address, data and control portions. System memory or main memory 112 is coupled to the host bus 110 by means of memory controller 114. The host bus 110 is coupled to an expansion or input/output (I/O) bus 118 by means of a bus controller 116. The expansion bus 118 includes slots for various other devices, preferably including a video card 120 for connecting to a video monitor 121, a floppy drive 122 and hard drive 124. A DMA (direct memory access) controller 126 is also coupled to the expansion bus 118. The DMA controller 126 operates to transfer data between peripheral devices on the expansion bus 118 and the main memory 112.

A parallel port 128 based on the Extended Capabilities Parallel Port (ECP) standard is also coupled to the expansion bus 118. The ECP is a parallel port standard jointly developed by Microsoft and Hewlett Packard and is now IEEE Standard 1284. The ECP standard parallel port includes a 16 byte first-in first-out (FIFO) buffer 130. The ECP parallel port 128 also includes a test mode wherein the FIFO 130 can be accessed by software which can manually read and write to the FIFO buffer 130. The ECP parallel port 128 also includes an operating mode whereby the FIFO buffer 130 is filled or emptied by DMA cycles. If the parallel port 128 is in operating mode and the FIFO buffer 130 contains data, the CPU 102 can direct the FIFO buffer 130 to empty its contents. This causes the DMA controller 126 to initiate DMA transfer cycles to transfer the data from the FIFO buffer 130 to system memory 112. As discussed further below, the ECP parallel port 128 is used according to the present invention to implement cache snoop diagnostics through-software. For more information on the ECP parallel port 128, please see the "Extended Capabilities Port: Specification Kit" Revision 1.03, published Feb. 10, 1993, available from Microsoft Corp., which is hereby incorporated by reference. Please also see the IEEE Standard 1284 specification, which is hereby incorporated by reference. In the preferred embodiment, the ECP parallel port 128 is provided in the PC87332VF chip produced by National Semiconductor. In the present disclosure, the ECP parallel port 128 is also referred to as the extended capabilities parallel port.

Figure 2:
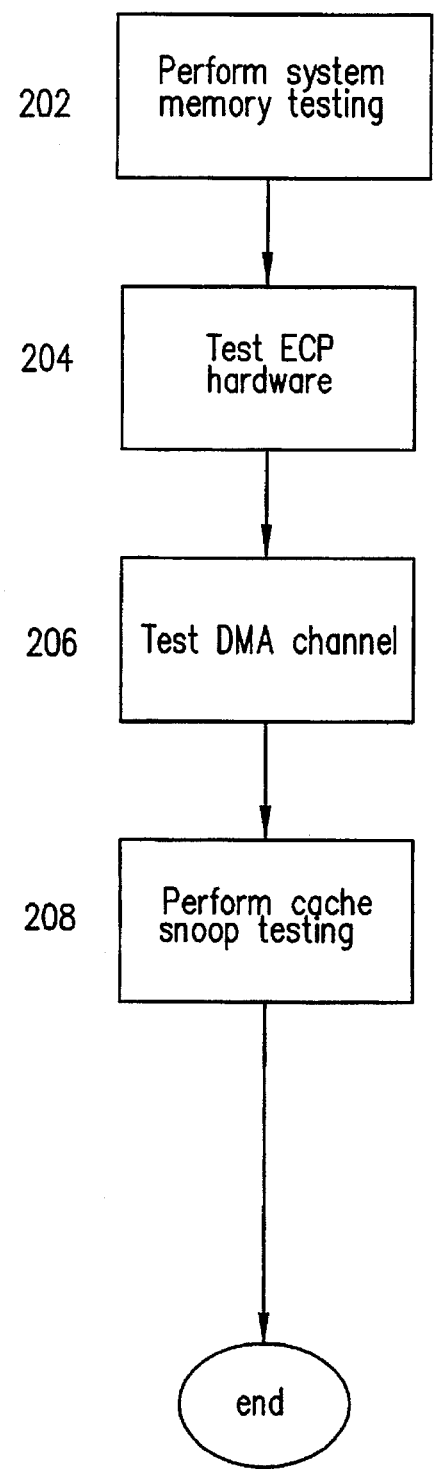
FIG. 2 is a flowchart diagram illustrating the testing performed in the preferred embodiment.
Figure 3:
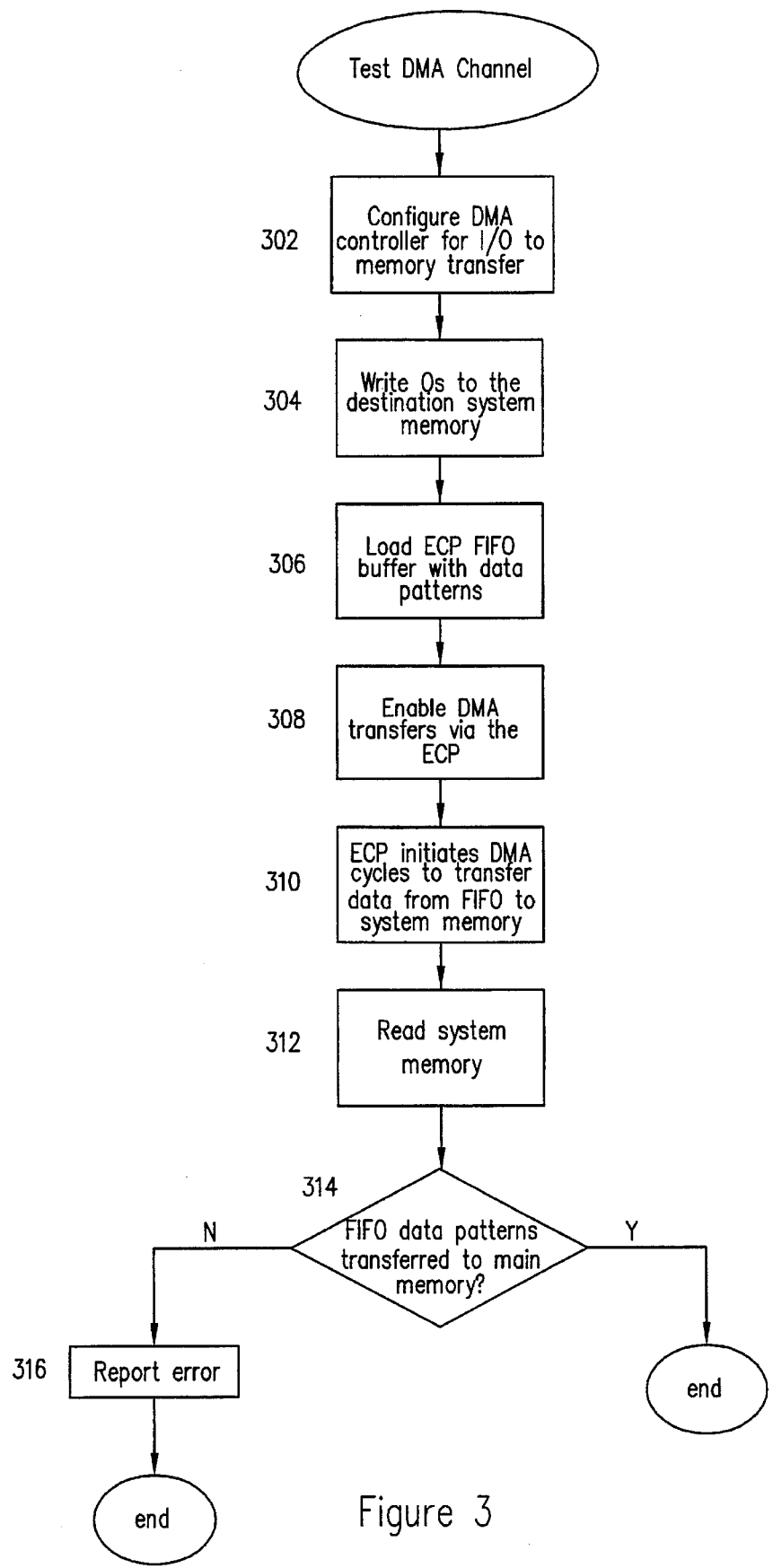
FIG. 3 is a flowchart diagram illustrating the testing, of the DMA channel in the preferred embodiment.
Figure 4:
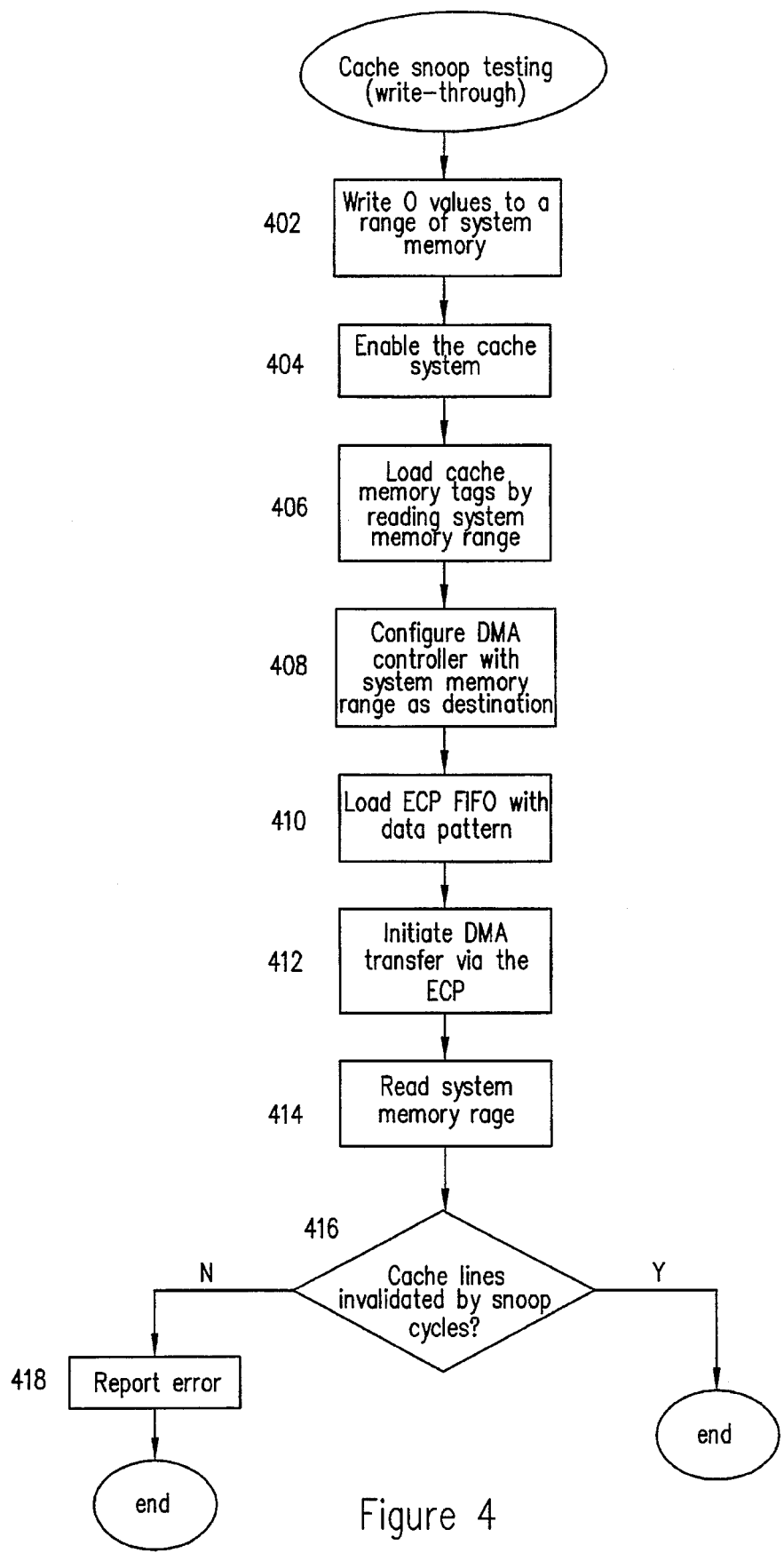
FIG. 4 is a flowchart diagram illustrating cache snoop testing of a write-through cache in the preferred embodiment.
Figure 5:
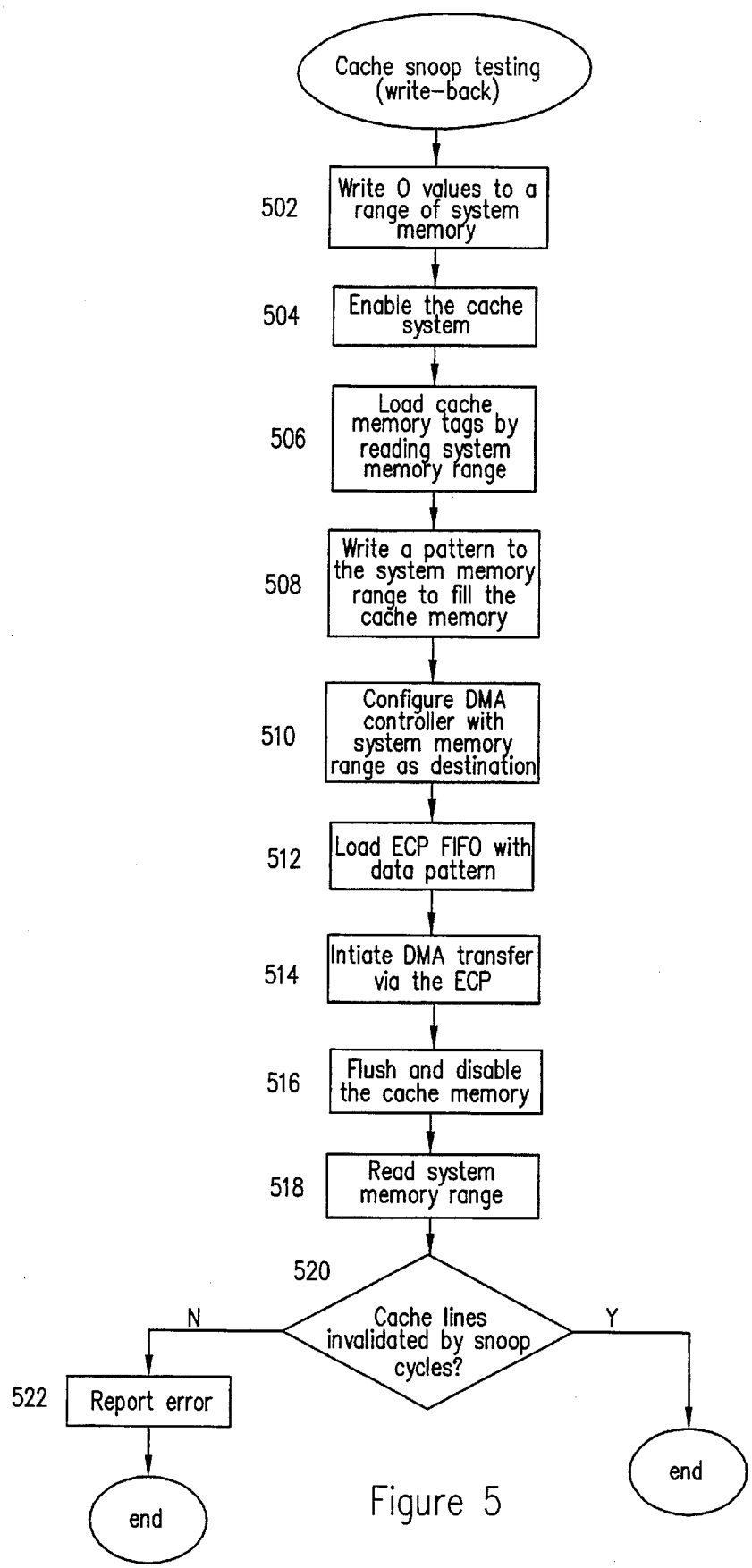
FIG. 5 is a flowchart diagram illustrating cache snoop testing of a write-back cache in the preferred embodiment.

In the preferred embodiment, cache snoop testing is performed after certain other subsystems have been tested to ensure that the system can differentiate between cache snoop failures and other subsystem failures. Referring now to FIG. 2, a flowchart diagram illustrating various testing procedures performed on the computer system of FIG. 1 is shown. In step 202 the computer system performs a test of system or main memory 112. As is well known in the art, this comprises writing various patterns to the system memory 112 and then reading these patterns back to determine if the system memory 112 is operating properly. In step 204 the computer system tests the ECP parallel port hardware to ensure that the ECP registers and the FIFO buffer 130 are both readable and writable. In step 206 the computer system tests the operation of the DMA channel. Step 206 is illustrated in FIG. 3 and is described below. In step 208 the computer system diagnostics perform cache snoop testing according to the present invention. Two preferred methods for performing cache snoop testing are illustrated in FIGS. 4 and 5 and are discussed more fully below.

Referring now to FIG. 3, the testing of the DMA channel performed in step 206 of FIG. 2 is illustrated. In step 302 the respective diagnostics instruct the CPU to configure the DMA controller for an I/O to memory transfer operation, In step 304 the CPU 102 writes zero values to a respective destination in system memory 112. In step 306 the CPU 102 loads the ECP FIFO buffer 130 with data patterns. In step 308 the CPU 102 enables DMA transfers via the ECP parallel port 128. This involves setting bit 5 of the DCR register 201 in the parallel port 128. In step 310 the ECP parallel port 128 initiates DMA cycles to transfer data from the FIFO buffer 130 to the system memory 112. In step 312 the CPU 102 reads the system or main memory 112 to ensure that the data patterns written to the FIFO buffer 130 in the ECP parallel port 128 were transferred properly to system memory 112 by the DMA controller 126. If the FIFO data patterns were determined to be properly transferred to the system memory 112 in step 314, then DMA channel testing completes. If the FIFO data patterns were determined to not have been properly transferred to the system memory 112 in step 314, then an error is reported in step 316 and operation completes.

As previously discussed, in the preferred embodiment the computer system performs tests on various subsystems prior to performing cache snoop testing to ensure that the computer system can differentiate between failure of the cache snooping operation in the cache system and failure of a different hardware subsystem. As shown in FIG. 2, once the various subsystems have been tested in steps 202, 204, and 206, cache snoop testing is performed in step 208. In the preferred embodiment of the invention, the cache snoop testing utilizes the sixteen bit FIFO buffer 130 in the ECP parallel port 128. This allows cache snoop testing to be performed reliably in software without requiring use of the disk drive subsystem to initiate the necessary DMA cycles to perform cache snoop testing. As discussed in the background section, cache snoop testing using the disk drive subsystem of the computer system is extremely unreliable due to the fact that disk drive media failures are much more likely to occur than cache snoop failures, and it is impossible to differentiate between a disk drive media failure and a cache snoop failure. Cache snoop testing using the ECP parallel port 128 according to the present invention provides a much more reliable way of performing cache snoop testing in software, i.e., provides a simpler and more reliable method for isolating failures in the cache system. Further, cache snoop testing can be performed on standard computer systems whereby the testing is independent of the external media or disk drive system used in the computer system.

In the preferred embodiment of the invention, cache snoop testing involves writing values to the sixteen bit FIFO 130 in the ECP parallel port 128 and then initiating DMA cycles to transfer this data to the system memory. Various other steps are preferably involved, such as enabling the cache and filling the cache tags with addresses to ensure that the cache system snoops these DMA transfers. The computer system can then determine if these snoop cycles actually occurred, and thus can determine if the cache snooping operation is performing properly.

Referring now to FIGS. 4 and 5, flowchart diagrams illustrating two methods for performing cache snoop testing according to the present invention are shown. The present invention includes the capability to generate DMA cycles that transfer data into system memory 112 in software without requiring use of the disk drive subsystem and also without requiring expensive custom test hardware. It is noted that many algorithms can be developed for cache snoop testing once the capability to generate DMA cycles in software exists. Therefore, it is noted that many different cache snoop testing algorithms can be performed in step 208. The cache snoop testing algorithms that can be performed in step 208 necessarily vary, depending upon the cache architecture, i.e., write-back versus write-through and either L1 cache only, L2 cache only, or both L1 and L2 cache systems. FIGS. 4 and 5 merely illustrate two cache snoop testing algorithms that can be used utilizing the methods of the present invention.

Referring now to FIG. 4, a cache snoop testing method for testing the snooping operations of a write-through or write-back cache system is shown. The method in FIG. 4 is preferably performed for a cache architecture including only a single cache system, i.e., a system having either only the L1 cache 109 or only the L2 cache system 104. In step 402 the cache snoop testing diagnostics instruct the CPU 102 to write zero values to a range of system memory 112. In step 404 the CPU 102 enables the cache system. In step 406 the CPU 102 loads the cache tags by reading the system memory range where zeros were written to in step 402. The CPU read operation performed in step 406 first checks the cache memory to determine if the requested data resides in the cache memory. Since the cache system was just enabled in step 404 and is thus empty, the CPU 102 will be required to obtain the data from system memory 112. This data will be then returned and stored into the cache memory, and the corresponding upper address bits will be loaded into the respective tags. Thus, reading the system memory range operates to load the cache memory tags.

In step 408 the CPU 102 configures the DMA controller 126 with the system memory range written to in step 402 as the destination. In step 410 the CPU 102 loads the ECP FIFO buffer 130 with a data pattern, such as A5. It is noted that loading the ECP FIFO buffer 130 does not operate to load the cache memory with these values since most cache systems do not cache write data unless data corresponding to the locations being written to already resides in the cache. Further, the write to the FIFO buffer 130 is an I/O write, and most cache systems only cache data involving memory accesses and do not cache data involving I/O accesses.

In step 412 the CPU 102 initiates a DMA transfer via the ECP parallel port 128. During this DMA transfer, if cache snooping is operating properly the cache system will snoop these cycles, a snoop hit will occur on each cycle, and the cache system will invalidate the respective lines in the cache memory where this data resides. In step 414 the CPU 102 reads the system memory range. Here, the computer system determines whether the cache lines corresponding to the system memory range were invalidated by snoop cycles. If the respective cache lines were not invalidated by snoop cycles, then the data will be read from the cache memory, not from the system memory 112. In this case, the CPU 102 will detect that the patterns written to the system memory 112 by the DMA cycles in step 412 were not received by the CPU 102 in the read operation performed in step 414. This information can then be used to determine whether the cache lines were invalidated by snoop cycles. If the cache lines were determined to have been invalidated by snoop cycles in step 416, then cache snoop operation is performing normally and operation completes. If the cache lines were determined to not have been invalidated by snoop cycles in step 416, then an error is reported in step 418 and operation completes.

Referring now to FIG. 5, a cache snoop testing method for testing the snooping operations of a write-back cache system is shown of the cache. This method tests the snooping functions of a write-back cache as well as the flushing and disabling functions of the cache. As with the method shown in FIG. 4, this method is preferably used in a cache architecture that includes only a single cache system. In step 502 the cache snoop testing diagnostics instruct the CPU 102 to write zero values to a range of system memory 112. In step 504 the CPU 102 enables the cache system. In step 506 the CPU loads the cache tags by reading the system memory range where zeros were written to in step 502. The CPU read operation performed in step 506 first checks the cache memory to determine if the requested data resides in the cache memory. Since the cache system was just enabled in step 504 and is thus empty, the CPU 102 will be required to obtain the data from system memory 112. This data will be then returned and stored into the cache memory, and the corresponding upper address bits will be loaded into the respective tags. Thus, reading the system memory range operates to load the cache memory tags.

In step 508 the CPU 102 writes a pattern, such as 5A, to the system memory range to fill the cache memory. Since the cache system is a write-back cache, the write data will be stored in the cache memory but will not actually be written to the system memory 112. In step 510 the CPU 102 configures the DMA controller 126 with the system memory range written to in step 502 as the destination. In step 512 the CPU 102 loads the ECP FIFO buffer 130 with a data pattern, such as A5. It is again noted that this step of loading the ECP FIFO buffer 130 does not operate to load the cache memory with these values. In step 514 the CPU 102 initiates a DMA transfer via the ECP parallel port 128. During this DMA transfer, if cache snooping is operating properly the cache system will snoop these cycles, as snoop hit will occur on each cycle, and the cache system will invalidate the respective lines in the cache memory where the data resides. It is noted that, after this transfer, the system memory 112 will contain an A5 pattern of data, and the cache memory will either have invalid lines if the snooping operation functioned properly, or will contain the 5A pattern written to the cache memory in step 508 if snooping is not operating properly.

In step 516 the CPU 102 flushes and disables the cache memory. This causes the cache system to write the data in its cache memory to the system memory 112. In step 518 the CPU 102 reads the system memory range. Here, the computer system determines whether the cache lines corresponding to the system memory range were invalidated by snoop cycles. If the respective cache lines were properly invalidated by snoop cycles, no data will have been written from the cache memory to the system memory 112 when the cache was flushed and disabled in step 516, and thus the CPU 102 will receive the A5 pattern from the system memory 112 in step 518. If the respective cache lines were not invalidated by snoop cycles, then the modified lines from the cache memory containing the 5A pattern will have been written to the system memory 112 when the cache was flushed and disabled in step 516, thus overwriting the A5 patterns written to system memory 112 by the DMA cycles in step 514. In this case, the CPU 102 will detect that the A5 patterns written to the system memory 112 by the DMA cycles in step 512 were not received by the CPU 102 in the read operation performed in step 518.

The data received in the read operation of step 518 is used to determine whether the cache lines were invalidated by snoop cycles. If the cache lines were determined to have been invalidated by snoop cycles in step 520, then cache snoop operation is performing normally and operation completes. If the cache lines were determined to not have been invalidated by snoop cycles in step 520, then an error is reported in step 522 and operation completes.

Therefore, FIGS. 4 and 5 illustrate various methods that can be used to perform cache snoop testing on both write-through and write-back cache systems. It is noted that the methods illustrated in FIGS. 4 and 5 and discussed above may be easily adapted to cache architectures which include both L1 and L2 cache systems. For example, each of these methods may be performed on a cache architecture having both L1 and L2 cache systems by only enabling and testing one of the caches at a time. For example, one method would be to enable the L1 cache with the L2 cache disabled and perform cache snoop testing on just the L1 cache. If the L1 cache snooping is determined to be operating properly, then the L1 cache system can be disabled and the L2 cache system enabled and cache snoop testing can be performed on the L2 cache. In this manner, cache snooping can be performed individually on both L1 and L2 cache systems.

Alternatively, it is noted that many L1 cache systems include a set of test registers for reading the contents of the L1 cache system. For example, microprocessors produced by Intel Corporation of Santa Clara, Calif. which include an on-chip L1 cache also include on-chip test registers for reading the contents of the L1 cache independently of whatever data is stored in the L2 cache. In such a system both the L1 and L2 caches can be enabled and either of the methods illustrated in FIGS. 4 or 5 can be used to perform cache snoop testing on both the L1 and L2 caches simultaneously. If an error is reported, the CPU 102 can read the test registers to determine the contents of the L1 cache and thus can determine whether the snooping operation of the L1 cache or the L2 cache system did not perform properly. Therefore, the present invention can be used to perform cache snoop testing on both write-through and write-back caches as well as L1, L2 or both L1 and L2 cache systems.

It is further noted that cache snoop testing methods other than those illustrated in FIGS. 4 and 5 may be used according to the method of the present invention. For example, the methods illustrated in FIGS. 4 and 5 assume that the cache systems invalidate their respective lines when another host or bus master writes updated data to the system memory 112 that also resides in the cache. Different cache snoop testing methods can be used for those cache systems that update their respective lines when another host or bus master writes updated data to the system memory 112, as opposed to cache systems that invalidate the respective lines.

Therefore, a method and apparatus for performing cache snoop testing reliably in software is shown. The method of the present invention uses a FIFO buffer in the ECP parallel port to initiate DMA cycles in software. This provides much more reliable cache snoop testing than can be provided using disk drive subsystems to initiate DMA cycles, as was done in the prior art. This also provides reliable cache snoop testing without the need for expensive custom test hardware.

Although the method and apparatus of the present invention has been described in connection with the preferred embodiment, it is not intended to be limited to the specific form set forth herein, but on the contrary, it is intended to cover such alternatives, modifications, and equivalents, as can be reasonably included within the spirit and scope of the invention as defined by the appended claims.

We claim:

1. A method of performing cache snoop testing in a computer system, the computer system comprising a CPU, system memory coupled to the CPU, a cache system coupled between the CPU and the system memory, a direct memory access controller coupled to the system memory and to the CPU, and a buffer coupled to the direct memory access controller, the system memory and the CPU, the method comprising the steps of:

loading cache lines of the cache system with data values corresponding to a system memory range;

writing a data pattern to the buffer;

transferring, under control of the direct memory access controller, said data pattern from the buffer to the system memory in said system memory range; and reading said system memory range to test whether a cache snoop occurred properly, said cache snoop occurring properly when the cache lines in the cache system corresponding to said system memory range to which the data pattern is transferred are invalidated.

2. The method of claim 1, further comprising the steps of:

determining if said data pattern is received by the system memory in said step of reading said system memory range; and reporting an error if said data pattern is not received by the system memory in said step of reading said system memory range.

3. The method of claim 1, further comprising the step of:

writing a plurality of values to said system memory range of said system memory prior to said step of loading said cache lines of the cache system with data values; and wherein said step of loading cache lines of the cache system with data values includes reading said system memory range in the system memory, wherein reading said system memory range in the system memory causes said data values to be loaded into the cache system from said system memory and also causes tags to be loaded into the cache system.

4. The method of claim 1, wherein the transferring step further includes the step of:

configuring the direct memory access controller with said system memory range as a destination for transferring the data pattern.

5. The method of claim 1, wherein the computer system further comprises an extended capabilities parallel (ECP) port, and wherein the buffer is comprised in the ECP port, the method further comprising the step of:

initiating the transferring step by writing one or more bits to the ECP port.

6. The method of claim 1, wherein said cache system is a write-through cache system.

7. The method of claim 1, wherein said cache system is a write-back cache system.

8. The method of claim 7, wherein cache lines may be valid modified cache lines; and further comprising the steps of:

flushing the cache system after said step of transferring and prior to said step of reading said system memory range, wherein said flushing causes valid modified cache lines in the cache memory to be written back to the system memory; and disabling the cache system after said step of flushing and prior to said step of reading said system memory range.

9. The method of claim 8, further comprising the steps of:

determining if said data pattern is received by the system memory in said step of reading said system memory range; and reporting an error if said data pattern is not received by the system memory in said step of reading said system memory range.

10. A method of performing cache snoop testing in a computer system comprising a CPU, system memory coupled to the CPU, a cache system coupled between the CPU and the system memory, a direct memory access controller coupled to the system memory and to the CPU, and an extended capabilities parallel port coupled to the direct memory access controller, the system memory and the CPU, wherein the extended capabilities parallel port includes a buffer, the method comprising the steps of:

loading cache lines of the cache system with data values corresponding to a system memory range;

writing a data pattern to the buffer in the extended capabilities parallel port;

transferring under control of the direct memory access controller said data pattern from the buffer to the system memory in the system memory range; and reading said system memory range to test whether a cache snoop occurred properly, said cache snoop occurring properly when the cache lines in the cache system corresponding to the system memory range to which the data pattern is transferred are invalidated.

11. The method of claim 10, further comprising the steps of:

determining if said data pattern is received by the system memory in said step of reading said system memory range; and reporting an error if said data pattern is not received by the system memory in said step of reading said system memory range.

12. The method of claim 10, further comprising the step of:

writing a plurality of values to said system memory range of said system memory prior to said step of loading said cache lines of the cache system with data values; and wherein said step of loading cache lines of the cache system with data values includes reading said system memory range in the system memory, wherein reading said system memory range in the system memory causes said data values to be loaded into the cache system from said system memory and also causes tags to be loaded into the cache system.

13. The method of claim 10, wherein the transferring step further includes the step of:

configuring the direct memory access controller with said system memory range as a destination for transferring the data pattern.

14. The method of claim 10, further comprising the step of:

initiating the transferring step by writing one or more bits to the extended capabilities parallel port.

15. The method of claim 10, wherein said cache system is a write-back cache system and cache lines may be valid modified cache lines; and further comprising the steps of:

flushing the cache system after said step of transferring and prior to said step of reading said system memory range, wherein said flushing causes valid modified cache lines in the cache memory to be written back to the system memory; and disabling the cache system after said step of flushing and prior to said step of reading said system memory range.

16. A computer system which performs cache snoop testing, comprising:

a CPU;

system memory coupled to the CPU;

a direct memory access controller coupled to the system memory and the CPU;

an ECP parallel port coupled to the direct memory access controller, the system memory, and the CPU, wherein the ECP parallel port includes a buffer;

a cache system coupled between the CPU and the system memory, the cache system performing a snoop function on data transferred from the buffer to the system memory;

means for writing a data pattern to the buffer;

means for initiating operation of the direct memory access controller to transfer said data pattern from said buffer to a system memory range in said system memory, the cache system invalidating cache lines corresponding to the system memory range during said transfer if the cache snoop function is operating properly; and means for reading the system memory range to determine if the cache snoop function occurred properly.

17. The computer system of claim 16, further comprising:

means for determining if said data pattern is received by the system memory; and means for reporting an error if said data pattern is not received by the system memory.

18. The computer system of claim 17, further comprising:

means for writing a plurality of values to said system memory range;

means for enabling the cache system; and means for loading the cache system with data values and for loading tags into the cache system after said cache system is enabled.

* * * * *